June 17, 1958 J. J. BERNSTEIN 2,839,676

HIGH FREQUENCY TUNERS

Filed Feb. 5, 1954 4 Sheets-Sheet 1

INVENTOR
Jack J. Bernstein

BY Raphael Fourover.
ATTORNEY

June 17, 1958 J. J. BERNSTEIN 2,839,676

HIGH FREQUENCY TUNERS

Filed Feb. 5, 1954 4 Sheets-Sheet 2

INVENTOR

Jack J. Bernstein

BY Raphael Yourover

ATTORNEY

June 17, 1958 J. J. BERNSTEIN 2,839,676

HIGH FREQUENCY TUNERS

Filed Feb. 5, 1954 4 Sheets-Sheet 3

INVENTOR

Jack J. Bernstein

BY Raphael Gourover

ATTORNEY

June 17, 1958 J. J. BERNSTEIN 2,839,676

HIGH FREQUENCY TUNERS

Filed Feb. 5, 1954 4 Sheets-Sheet 4

INVENTOR.
Jack J. Bernstein
BY
Raphael Tourover.

United States Patent Office 2,839,676

Patented June 17, 1958

2,839,676

HIGH FREQUENCY TUNERS

Jack J. Bernstein, Levittown, N. Y., assignor to Ebert Electronics Company, New York, N. Y., a partnership Application February 5, 1954, Serial No. 408,425

6 Claims. (Cl. 250—20)

The present invention relates generally to tunable resonant devices, and more particularly to highly selective circuits, tunable over an extremely wide frequency spectrum, and capable of economical fabrication.

The commercial need for devices of the type forming the subject matter of the present invention arises in considerable part from the introduction of the ultra high frequency band into television broadcasting, although the invention is not limited to such use. This band includes roughly the frequencies 400 mc. to 1000 mc. Receivers for this band desirably include therefore, a tuning device of simple character, capable of economical reproduction by mass production techniques, and which may be readily tuned over the band recited. Since tuners of this type must be capable of selecting any one ultra high frequency television channel, without interference from any other, the selectivity of the tuners must be quite high, and must remain reasonably constant over the entire tuning band. The device must be mechanically sturdy, and capable of sustaining an enormous number of tuning operations without substantial variation of calibration, and without requiring adjustment.

It is further desirable to provide not only a single tuned circuit, but an entire receiver front end assembly, having the characteristics above enumerated, and including preferably a radio frequency tuned input circuit, a local oscillator, and a mixer circuit, tunable in tracking relation over the ultra high frequency band in response to a single mechanical control, such as a rotatable knob. The receiver front end must be reproducible by mass production methods, must occupy a relatively small space, and must require utilization of a minimum number of mechanical and electrical elements. The recited characteristics imply that the tuned circuits comprising the receiver front end are highly linear.

It is an object of the present invention to provide a tunable resonant circuit device, suitable for use in the ultra high frequency range.

It is a more specific object of the present invention to provide a tunable resonant circuit capable of being tuned over an ultra high frequency band having a ratio of maximum to minimum frequency of at least 2.5 to 1, a linear tuning characteristic, and relatively constant high selectivity over the band.

A still more specific object of the invention resides in the provision of a tuner capable of effective utilization over the entire presently allocated ultra high frequency television band, and having the electrical characteristics requisite to service in a television receiver designed for ultra high frequency operation.

It is another object of the present invention to provide a wide frequency range tuner of particularly simple mechanical construction.

Still a further object of the present invention resides in the provision of a wide frequency range ultra high frequency tuner having no sliding or moving conductive contacts between its movable elements.

Another object of the invention resides in the provision of a balanced tunable resonant circuit device employing a single stationary element and a single movable element, arranged in juxtaposition but not in contact.

A further object of the invention resides in the provision of a simple compact mechanical movement, for translating rotation of a control knob into translational motion of a movable circuit tuning element.

It is a more comprehensive object of the present invention to provide a receiver front end assembly including a radio frequency selector, a local oscillator and a mixer effectively ganged and readily trackable over an extremely wide spectrum in the ultra high frequency region.

It is still a further object of the invention to provide tuning units which may be intercoupled electromagnetically, and without the use of interconnecting conductors and which may be provided with balanced output and/or input connections for supplying the circuits with signal, or deriving signal therefrom.

The above and still further features, objects and advantages of the present invention will become apparent upon consideration of the following detailed description of a preferred embodiment thereof, especially when taken in conjunction with the accompanying drawings, wherein.

Figure 1:
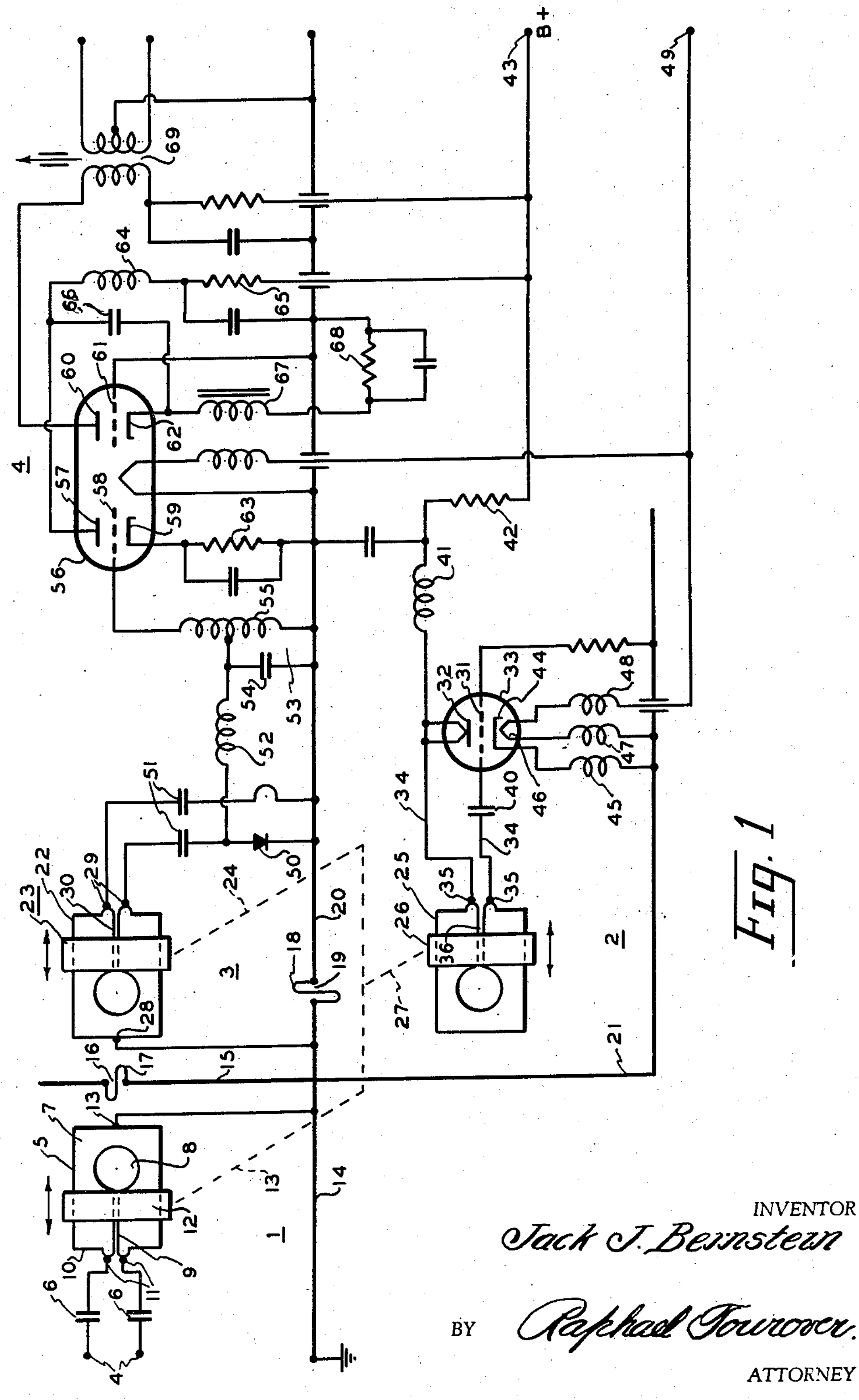
Figure 1 is a circuit diagram of a receiver front end suitable for use in ultra high frequency television receivers, and comprising a tuned R. F. selector, local oscillator and mixer.

Briefly describing the tunable circuit of the present invention, it comprises a basic tunable resonant circuit in the form of a thin substantially rectangular sheet of metal having a circular aperture extending through the sheet, and a narrow slot extending from one of the edges of the sheet, to the circular aperture. Tuning is accomplished by moving a noncontacting slider so as progressively to cover or uncover the slot and aperture. I am aware of broadly similar structures, including one disclosed in U. S. Patent No. 2,483,893 to F. C. Everett, issued October 4, 1949, and have experimented with devices of that character. I have found that, in order to establish the tuning range, the selectivity, and the linearity required for present day U. H. F. television tuners, the dimensions of the slot, above referred to, are relatively critical as to maximum width, and while I do not fully understand the theory involved, it appears that the width found to be actually optimum is not such as would be expected from the circuit theory usually advanced as explaining the operation of resonant circuits of the character described.

It is sometimes presumed that the slot of a tuner, such as above briefly described, is a capacitance, and that the aperture which terminates the slot is an inductance. Were this theory in fact true, the circuit could be designed for higher frequency operation by widening the slot, to decrease capacity. In fact, it is found that maximum frequency can be increased by decreasing the width of the slot, and that such decrease results in higher circuit selectivity. In fact, it has been found that a slot width of approximately .015" provides satisfactory operation, slot length being approximately 1", and aperture diameter .5", and that a somewhat narrower slot remains satisfactory but a substantially wider slot becomes less satisfactory. Considering the slot solely as a transmission line, the resonant frequency of the tuner should not be expected to vary as a function of line spacing, corresponding with slot width. In another view, the entire metallic sheet may be considered to be an inductance, viewed as including a path about the aperture, in series with a condenser, provided by the slot. In this view, a wider slot should provide a higher frequency of operation, which is contrary to fact.

In fact, it should be clear that the slot itself provides inductance and capacity, along its edges, so that the slot may be looked at as a combined inductance and capacity. In this view, it appears from my experiments that decreasing the width of the slot increases its capacity per unit of length but decreases its inductance per unit of length, and that the latter effect occurs at the more rapid rate, for the thickness of metal employed (.062"). It follows that the maximum frequency of the unit may be increased by decreasing slot width, despite the fact that such decrease increases capacity per unit length of the slot structure. The slot terminating circular aperture extends the lower frequency range of the tuner, by providing considerable inductance in the resonant circuit.

For the lower frequencies the slider shunts only a portion of the slot, and thereby provides increased effective length of the slot without affecting the aperture. The inductance of the latter is maximum simultaneously with increased capacity of the slot. For high frequencies the slider extends over the aperture, leaving the slot uncovered. This then reduces the inductance of the aperture and the capacitance of the slot.

It is found that tuning is linear with slider position over the U. H. F. television band and that circuit selectivity and stability is maintained at a high value over the frequency band. These effects occur not only when my novel tuning element is employed as an unloaded circuit element, but also when employed in a mixer having a crystal rectifier load, and when employed as the frequency determining element of an oscillator, so that a plurality of such diverse devices may be readily tuned in a mutually tracking relation.

Moreover, I have found that tuned circuits constructed in accordance with my invention may be readily coupled, one to another, without physical connections, such as transmission lines, leads, or the like, if desired, and that coupling may be entirely electromagnetic, which radically increases the simplicity of circuit assemblies employing a plurality of tunable circuit elements in accordance with my invention.

Referring now more specifically to the accompanying drawings, the reference numeral 1 denotes generally a radio frequency selector for a U. H. F. television receiver, the reference numeral 2 denotes a local oscillator for the receiver, the reference numeral 3 a mixer for the receiver, and the reference numeral 4 an intermediate frequency output circuit.

Signal is derived from a conventional source of signal, such as an antenna (not shown) and becomes available at balanced input terminals 4, which are coupled to balanced points of a tuner 5 via coupling condensers 6. The tuner 5, which will be hereinafter described in detail, consists generally of a sheet 7 of metal, having therein a relatively large circular aperture 8, and having a relatively narrow elongated slot 9 extending from the aperture 8 to an edge 10 of the sheet 7. The balanced input points of the tuner 5, are points 11, located one on each side of the slot 9 adjacent the edge 10 of the sheet 7. In order to render the tuner 5 tunable over the required band of frequencies a slider 12 is provided, having an area adequate to cover the aperture 8, if suitably positioned. The slider 12 is maintained in non-contacting relation to the sheet 7 and at constant spacing therefrom, by devices hereinafter explained, and motive means are provided for translating the slider 12 over the sheet 7, so as to cover and uncover progressively the slot 9 and the aperture 8, thereby to vary tuning. The motive means is denoted conventionally in Figure 1 by a dotted line 13.

The tuner 5 is grounded by a lead extending to a terminal 13 located symmetrically with the longitudinal center line of the slot 9.

Since Figure 1 is a schematic circuit diagram, details of construction are not illustrated therein, and in particular, length of leads as illustrated are of no significance.

The radio frequency selector is located in a shielded container, hereinafter further described, and the walls of which are represented in Figure 1 by the lines 14, 15. An aperture 16 is provided in wall 15, through which extends a coupling loop 17, which couples the R. F. selector 1 with the mixer 3. Similarly the mixer 3 is coupled with local oscillator 2 via a coupling loop 18 extending through an aperture 19 in wall 20. Local oscillator 2 is shielded or isolated, except for desired coupling via loop 18, by means of walls denoted in Figure 1 by numerals of reference 20, 21.

The mixer 3 and the local oscillator 2 are each tunable by a tuner, identical with the tuner 5, but suitably offset in frequency to take account of the required frequency difference between local oscillator frequency and incoming frequency, in a superheterodyne receiver. The mixer tuner, denoted 22, possesses a slider 23 actuated by motive means 24, conventionally illustrated. The local oscillator tuner, denoted 25, possesses a slider 26 actuated by motive means 27, conventionally illustrated.

The various motive means are ganged, to provide for ganged and tracking tuning of the various tuners 5, 22, 25.

The tuning element 22 is grounded, in a manner similar to the tuning element 5, by means of a terminal 28. The tuner 25 is, however, ungrounded. Ountput signal from tuner 22 is taken from points 29 straddling its slot 30, and oscillator tuner 25 is connected with the grid 31 and anode 32, of a triode 33 by means of leads 34 extending to points 35, respectively straddling the slot 35 of tuner 25.

It will be clear from the description to this point that the same terminal points may be employed for my novel tuner, whether signal is to be applied to or derived from the tuner, and further that the tuning element may be operated in balanced, unbalanced, or semi-balanced relation.

In order to isolate the anode 32 from the grid 31, a suitable condenser 40 is inserted in grid lead 34. The anode 32 is connected via an R. F. choke 41 and a voltage dropping resistance 42 to a B+ terminal 43. The cathode 44 of the triode 33 is connected to its shield wall 21 and hence to D. C. ground, via an R. F. choke 45. The heater 46 is connected at one side via an R. F. choke 47 to shield wall 21, and at its other side via an R. F. choke 48 to a source of heater current, at terminal 49.

The oscillator circuit is per se convention, its sole novel feature being the tuner construction. Accordingly, further description is dispensed with.

Referring now to mixer 3, the output of its tuner, at terminals 29, is applied to a crystal mixer 50, via coupling and D. C. isolating condensers 51. An intermediate frequency signal component thus appears across the crystal 50, and is applied via R. F. choke 52 to fixed tuned parallel circuit 53, tuned to the desired or standard I. F. frequency.

The tuned circuit 53 is comprised of a condenser 54, and a coil 55, the condenser 54 being connected across only part of the coil 55, so that the latter acts as a step-up auto-transformer, to feed a double triode amplifier 56. The auto-transformer may be designed for impedance matching.

The double triode amplifier 56 includes a first anode 57, grid 58 and cathode 59, and a second anode 60, grid 61 and cathode 62. The first cathode is conventionally biassed by a by-passed resistance 63, and driven at its grid 58 from coil 55. The first anode is loaded by an inductance 64, in series with decoupling by-passed resistance 65. The voltage at the anode 57 is coupled via coupling condenser 66 to cathode 62, the associated grid 61 being grounded. Cathode 62 is separated from ground by a relatively high impedance choke 67 in series with an I. F. by-passed bias resistance 68. An output transformer 69 is connected in the circuit of anode 60. The double triode 56 accordingly serves to amplify the I. F. signal generated in the mixer crystal 50, but the phase relationship of the signals at the respective grids 58 and 61 are such that the stage does not tend to oscillate due to feed-back from one tube to another.

While I have disclosed a specific I. F. amplifier circuit, it will be realized that this is for example only, and that any suitable amplifier known to the prior art may be substituted as desired, the amplifier per se forming no part of the present invention.

The general theory of superheterodyne receivers, the necessity for gauged tracking in such receivers, and the general theory of intermediate frequency amplifiers for such receivers, are well known in the art. The basic novelty of the present invention resides primarily in the specific U. H. F. tunable elements employed, the methods of gauging the tunable circuits, and the method of suitably intercoupling and isolating the tunable circuits.

Figure 2:
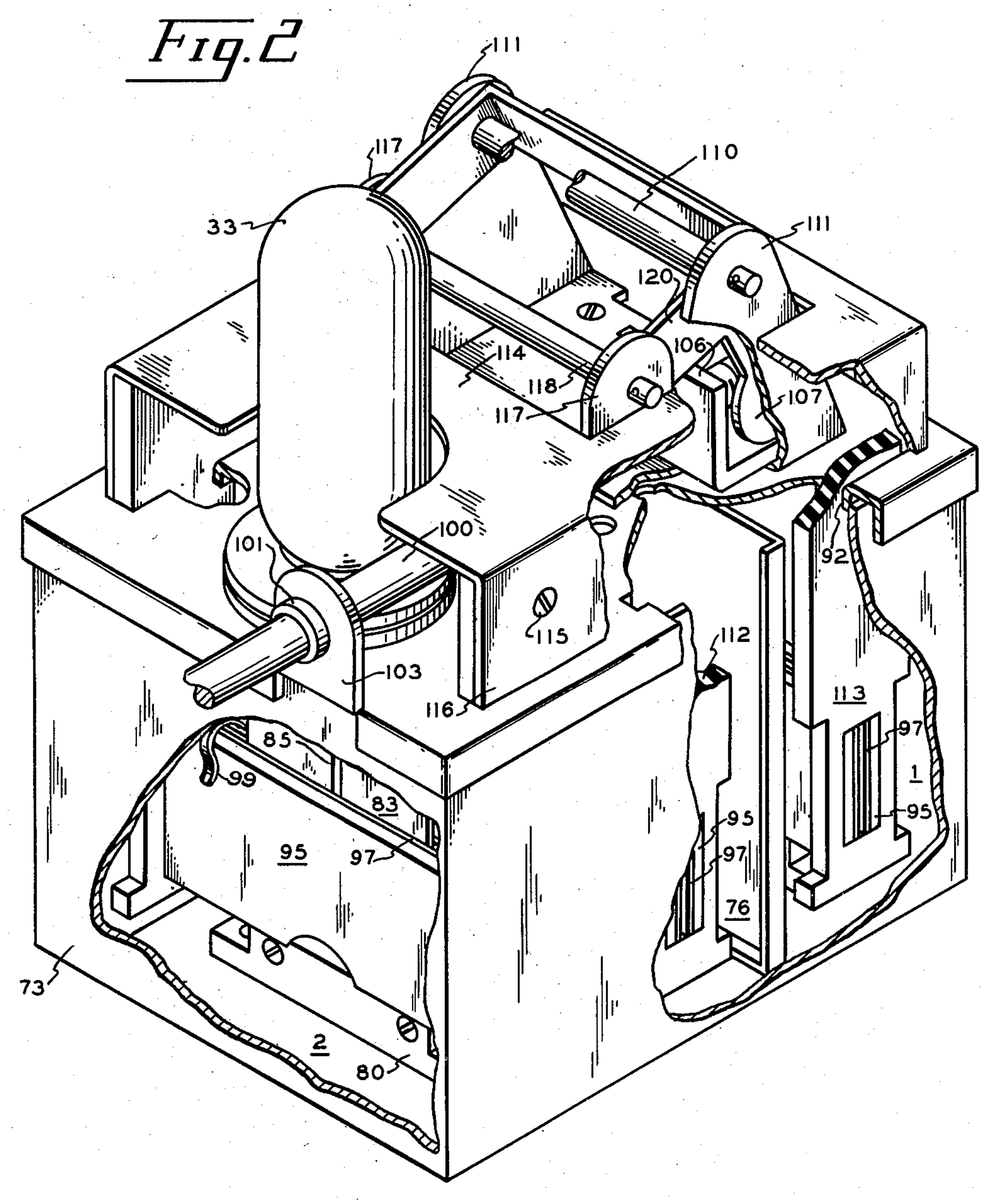
Figure 2 is a view in perspective of a complete tuner, in accordance with Figure 1, and illustrating in particular the mechanical features of the tuner.
Figure 4:
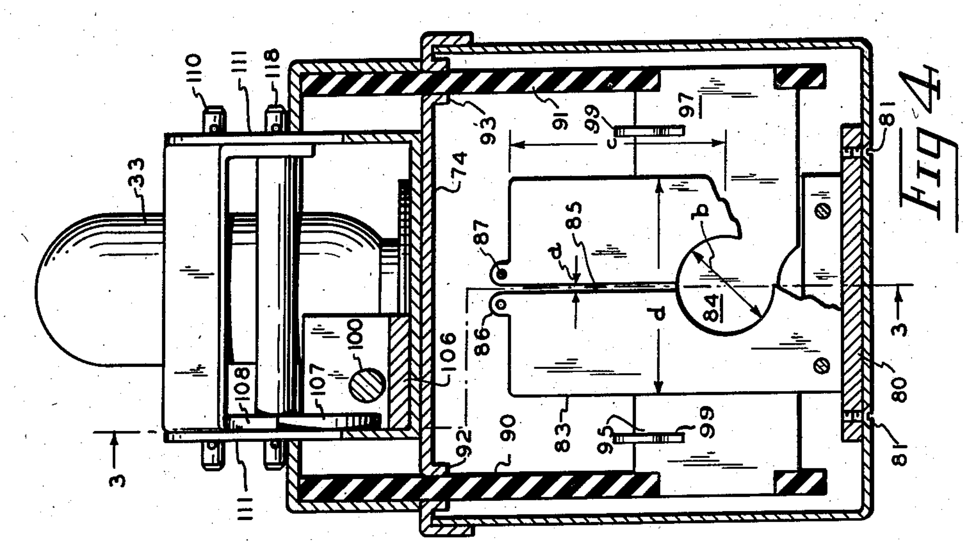
Figure 4 is a further view in vertical section taken on the line 4—4 of Figure 3.
Figure 3:
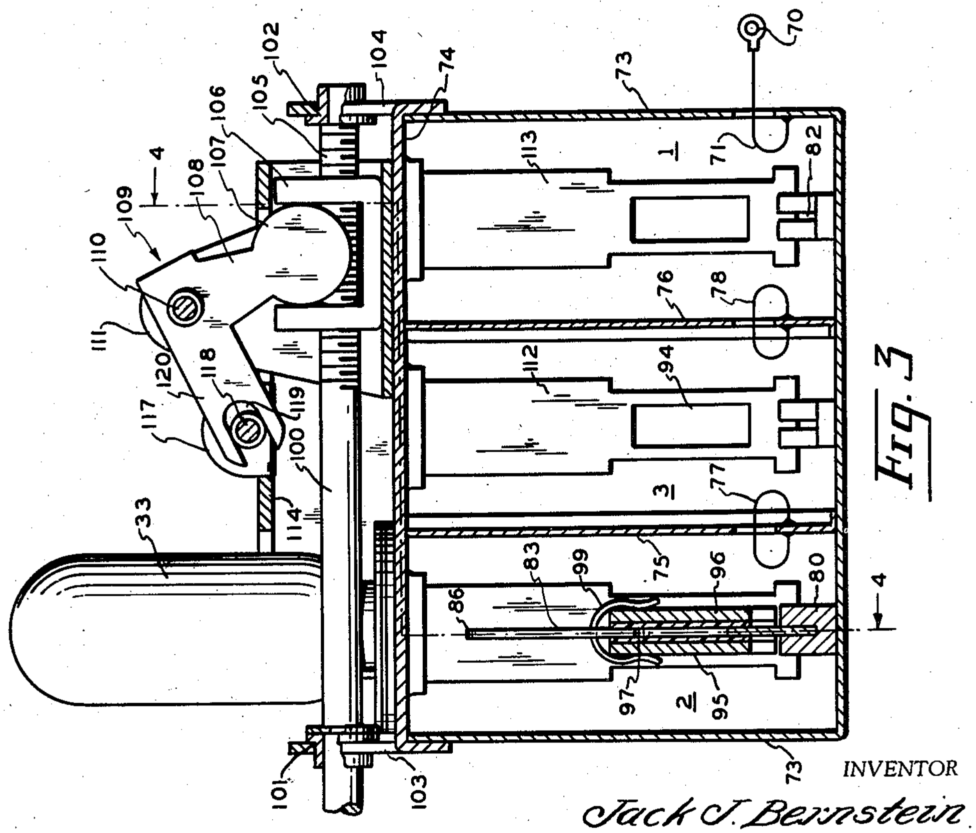
Figure 3 is a view in vertical section, taken on the line 3—3 of Figure 4.

Reference is accordingly made to Figures 2–4 of the accompanying drawings wherein is illustrated the mechanical details of a complete tuner, including R. F. selector 1, local oscillator 2, and mixer 3.

The signal input terminal, 70, in Figure 3, is seen to be single ended and to include an electromagnetic coupling loop 71. This connection is alternative to that illustrated in Figure 1, which represents a capacitive balanced coupling. Either input arrangement may be utilized, as desired.

The entire unit is seen to be contained in a rectangular metallic enclosure, 73, having a removable cover 74, and sub-divided into three mutually shielded compartments by metallic walls 75, 76. The compartments are identified by the numerals applied to the contained units; compartments 2 and 3, are intercoupled by loops 77, and compartments 1 and 3 by loop 78. The compartments themselves are designed to have no electrical cavity resonances over the band of frequencies employed, and provide the proper signal levels in the several compartments.

Considering now more specifically the contents of the compartment 2, the remaining compartments being substantially identical, and considering the view of Figure 4 as being a transverse view, the compartment 2 contains a vertical transversely extending standard 80, secured to the base of the container 73 by means of a pair of screws 81. The standard 80 is provided with a vertically extending transverse slot 82, within which rests one end of a metallic sheet 83, of rectangular outline, the sheet 83 extends vertically, and subsists in a transverse plane and is provided with circular aperture 84, symmetrically located transversely, and considerably below the center of the sheet 83, taken vertically. A narrow vertical slot 85 extends from the circular aperture 84 to the upper edge of the sheet 83, at which point the sheet 83 is provided with a pair of upstanding apertured lug-like extensions 86, having apertures 87, which enable wire connections to be made to points on either side of the slot 85.

I have found preferred dimensional values for the sheet 83, when designed for use in a U. H. F. television receiving system, to be as follows, by reference to Figure 4:

$a = .01562''$
$b = .500''$
$c = 1.00''$
$d = 1.125''$

The various dimensions are not critical, and may be varied to obtain various band width capabilities. The dimension $b$ in particular is important in controlling the lowest tunable frequency of the system, and the dimensions $a$ and $c$, the highest frequency. The value of $a$ may be decreased to attain a higher range, but not appreciably increased if the upper frequency limit of the U. H. F. television band is to be covered.

Extending vertically downwardly from and through the cover plate 74, is a pair of transversely widely separated insulative supports 90, 91, slidable vertically in slots 92, 93, provided in the cover plate 74.

The supports 90, 91 are provided with rectangular apertures 94, adjacent their lower ends, for supporting sliders 95, 96, extending one before and one behind the sheet 83, and separated therefrom by thin Teflon sheets 97, 98 respectively. A pair of U-shaped spring members 99, embrace the slider pairs, 95, 96, urging each slider into intimate contact with its Teflon sheet, and the Teflon sheets into contact with the metallic sheet 83, and maintaining this contact during vertical motion of the sliders 95, 96.

The sliders 95, 96 are arranged, in their lowermost position, completely to cover the circular aperture 84, and in their uppermost position completely to uncover the aperture 84. When the aperture 84 is completely covered its inductance is very low, being due only to leakage flux, existent in the space between the sliders 95, 96 and the metallic plate 83. This position of the sliders 95, 96 represents the high frequency tuning position of the unit, and in this position the resonant frequency of the tuner is due entirely to the uncovered portion of the slot 85. As the sliders 95, 96 are raised the aperture 84 is uncovered, and inductance is added to the circuit at the circular aperture 84, the capacity of the slot is increased, and with the increase of the inductance of the aperture 84, the net result is a decrease of the frequency of the unit.

Basically, then, the resonant frequency of the unit is determined by the presence of a slot having distributed inductance and capacity, and an aperture, having largely inductance. By making the slot narrow its capacity is increased but its inductance decreased. By suitable selection of slot size, the maximum frequency of the unit may be made high when the aperture is uncovered, the inductance of the aperture in combination with slot capacity and inductance governing, and a low frequency may be attained.

Extensive testing and experiments have shown that the system is relatively noise free, since sliding contacts are avoided, that no multimoding is present, and that response is linear and flat, with Q of about 300, over the television U. H. F. band.

In order to gauge tune the several units 1, 2, 3, I provide a cammed bell crank mechanism, responsive to rotation of a shaft 100, supported for rotation in bearings 101, 102, the latter being secured in vertical lugs 103, 104, extending above the level of the cover plate 74.

The shaft 100 is provided with screw threads 105, which threadedly engage a U-shaped cam 106, having vertically upstanding legs between which rides a cam follower 107. Rotation of the rod 100 accordingly results in longitudinal movement of the cam follower 107. The latter terminates one arm 108 of a bell crank 109, pivoted at its center on a transverse pin 110 which extends between vertical standards 111.

The insulating supports 90, 91, in the compartment 2, find companion supports 112, 113 in the compartments 1 and 3 respectively. The supports are severally secured to a plate 114, which extends parallel with the cover plate 74, as by screws 115 extending through short vertical extensions 116 of the horizontal plate 114. The plate 114 is further provided with a pair of transversely separated upwardly extending lugs 117, which support a transverse pin 118. The latter may be raised and lowered by the bell crank 109, being nested in a lost motion connection in the form of a slot 119, in the end of the arm 120 of the bell crank 109. The lost motion connection enables motion of pure vertical translation to be communicated to the rod 118, and hence to the supports 90, 91, 112, 113, in response to arcuate motion of the arm 120 of the bell crank 109.

While I have disclosed in Figure 1 of the accompanying drawings a pre-selector circuit which is capacitively coupled with an input signal source, such as an antenna, and have shown coupling elements intercoupling the several tuning elements, which employ solely electromagnetic coupling supplied by inductive loops extending through suitable apertures in shield walls, it will be realized that the operability of the tuning elements of the present invention is not restricted to any specific mode of coupling, and that various known coupling expedients may be employed in the invention. Various examples of suitable preselector and mixer stages are accordingly illustrated and described hereinafter.

Figures 5, 6:
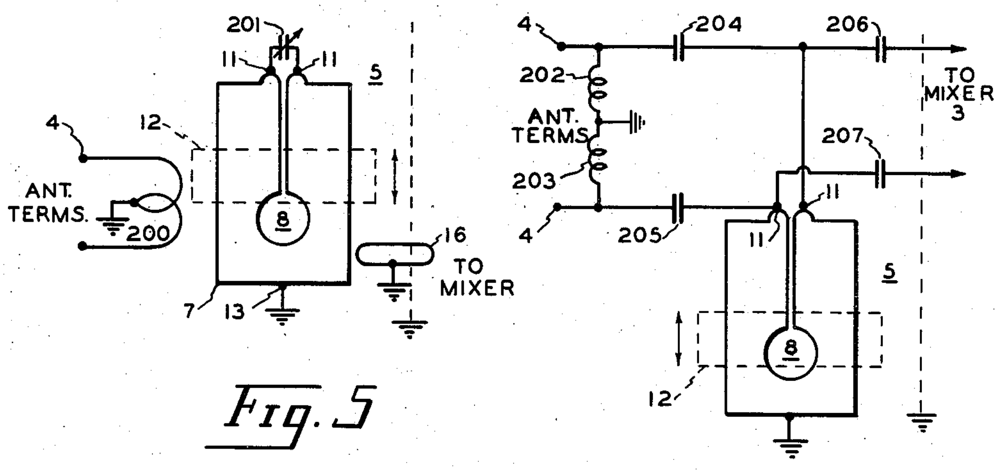
Figures 5 and 6 are schematic circuit diagrams of modified preselector stages suitable for substitution in the circuit diagram of Figure 1.

Referring now more specifically to Figure 5 of the accompanying drawings there is illustrated a pre-selector tuning element 5 which is electromagnetically coupled to a following mixer stage by means of a coupling loop 16, an arrangement which is in this respect identical with the structure illustrated in Figure 1 of the accompanying drawings. The antenna terminals 4 are coupled to the aperture, 8, by a balanced inductive coupling coil 200, the tuning element 5 being accordingly completely conductively isolated except for its symmetrical ground point 13, and being entirely electromagnetically coupled to both to its input signal terminals 4 and to its following mixer. In the system of Figure 5 the tuner 5 is provided with a trimmer capacity 201, which may be adjustable, and which may be connected between the points 11.

The coupling system of Figure 5 involves a cascade arrangement as between the antenna terminals 4, 4, the tuning element 5, and the mixer coupling unit 16. In Figure 6 of the accompanying drawings is illustrated a modification of the pre-selector tuning element in which the tuning element is arranged in a shunt path extending from antenna terminals 4 to the input terminals of mixer 3. More specifically, the terminals 4, 4 are balanced to ground by inductances 202, 203, grounded at their center point and are capacitively coupled by condensers 204, 205 to the terminals 11 of tuning element 5. The latter terminals are then connected by condensers 206, 207 to the terminals of the mixer 3. In this arrangement the tuner 5 is in shunt to the leads coupling between the antenna terminals 4, 4 and the mixer 3, and accordingly operates to establish a high impedance across the leads at the frequency for which the tuning element is tuned, and a relatively low impedance at other frequencies. Accordingly, only at the frequency for which the tuning element 5 is tuned does high amplitude signal proceed from the antenna terminals 4, 4 to the mixer 3.

Figure 7:
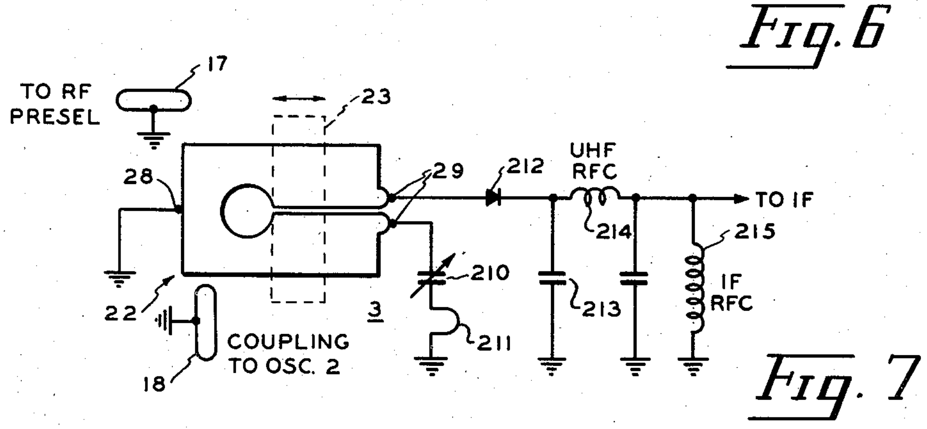
Figures 7 and 8 are schematic circuit diagrams of modified mixer stages suitable for substitution in the circuit diagram of Figure 1.

In Figure 1 of the accompanying drawings is shown a mixer 3 having electromagnetically coupled thereto a preselector circuit 1 and an oscillator circuit 2. This mode of coupling is duplicated in the embodiment of my invention illustrated in Figure 7 of the accompanying drawings, which however illustrates an alternative mode of connecting a crystal rectifier with terminals 29 of the tuning element 22. In Figure 7 of the accompanying drawings one of the terminals 29 is connected to ground via a trimmer tuning condenser 210 and an inductive loop 211 connected in series. The remaining terminal 29 is connected to one terminal of a crystal rectifier 212, the other terminal of which is connected to ground via a condenser 213, and also is connected in series with an ultra high frequency choke 214 and to an I. F. circuit 215.

Accordingly, while in Figure 1 of the accompanying drawings, I. F. signal is derived from across crystal rectifier 50, in the embodiment of my invention illustrated in Figure 7 of the accompanying drawings the crystal rectifier 212 is in series between a tuning element terminal 29 and a following I. F. amplifier stage, through a suitable R. F. choke and a suitable shunt I. F. circuit, provided for matching purposes primarily. In a practical embodiment of the invention, the condenser 213 may be omitted, since the usual circuit as constructed contains adequate inherent capacity to supply a capacitive path from one terminal of the crystal rectifier to ground.

Figure 8:
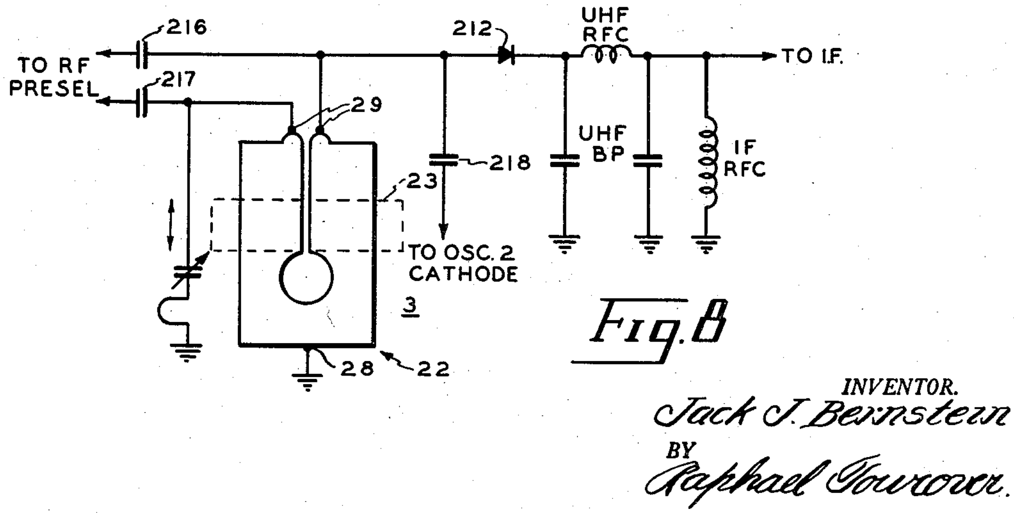

In the system of Figure 8 the connection to the tuner 3 is via capacitor coupling supplied by condensers 216, 217. As in the system of Figures 1 and 7, the tuning element 3 is symmetrically connected to ground at terminal 28, and the crystal rectifier 212 is connected in series from terminal 29 to a following I. F. amplifier. Connection to the oscillator 2, however, is in the system of Figure 8 provided by direct capacitive coupling, via the condenser 218, rather than by inductive coupling 18, as in Figures 1 and 7. It will be realized nevertheless that in either of Figures 1 and 7 the capacitive coupling illustrated in Figure 8 may be employed in coupling the mixer 3 to the oscillator 2, as in the alternative that embodiments of my invention illustrated in Figures 1 and 7. In the embodiment of my invention illustrated in Figure 8 of the accompanying drawings the electromagnetic coupling device illustrated in Figures 1 and 7 for coupling between the oscillator 2 and the mixer 3 may similarly be substituted for the connections shown.

In general while I have illustrated electromagnetic coupling for interconnecting various tuned circuits of the present invention, such coupling being particularly convenient as requiring no leads, and a minimum of soldered connections, direct connections may always be employed provided suitable capacitive isolating devices be provided to prevent application of undesired D. C. voltages. Accordingly a relatively wide variety of circuit coupling devices may be employed in accordance with practices known in the art. It is not however intended to imply that the various coupling devices suggested are all equivalents. The electromagnetic coupling expedients illustrated in Figure 1 of the accompanying drawings have been experimentally proved to have extreme advantages not only in respect to ease of assembly and wiring of the system, but also in providing more uniform coupling over the extremely wide bands envisaged in the operation of the system.

While I have illustrated electromagnetic coupling devices employing coupling loops, I have found that in practice the loops are not essential provided the slot in the shield walls 15 and 20 be made of adequate size. The precise length and width of these slots are determined, for any given range of frequencies, empirically. Nevertheless, I have determined that the use of such slots, when suitably dimensioned, enables even a more linear coupling over the extreme frequency range of operation of the present system, than is obtainable by the use of coupling loops, such as loop 17 or 18. Accordingly in a preferred embodiment of my invention loops 17 and 18 may be omitted and there may be substituted therefor solely slots, such as 16 and 19, in the shielding walls 15 and 20.

While I have described and illustrated several specific embodiments of the present invention, it will be realized that modifications in detail and in general arrangement may be resorted to without departing from the true spirit of the invention as defined in the appended claims.

What I claim is:

1. In combination, a local oscillator, a mixer, each of said local oscillator and said mixer including a tuner, means for gang tuning said tuners in tracking relation, means for solely electromagnetically coupling said tuners, each of said tuners including a sheet of metal having a relatively extensive aperture and a relatively narrow elongated slot extending from an edge of said sheet to said aperture, said slot having a width of substantially .015" and a length of substantially 1", said aperture having a periphery of substantially 1.5" long, said means for tuning each of said tuners being a slider including at least one metallic strip, means for slidably moving said at least one metallic strip over said sheet of metal in non-contacting relation to said sheet and parallel with the direction of elongation of said slot, said at least one metallic strip having an area adequate at least entirely to cover said aperture.

2. The combination according to claim 1 wherein said sliders each include two metallic strips in parallel planes located on either side of said sheet of metal.

3. The combination according to claim 2 wherein each of said sliders further includes two sheets of plastic insulating material, each interposed between one of said metallic strips and one of said sheets of metal, resilient means carried by said metallic strips of each of said sliders and urging said metallic strips, said insulating material and said sheet of metal of each of said sliders into contact.

4. The combination according to claim 3 wherein said sheets of metal are rectilinear and said metallic strips are rectilinear, wherein said movement of said sliders is a movement solely of translation, and wherein is provided a rotatable control rod, and screw means responsive to rotation of said control rod for actuating said sliders in said movement solely of translation.

5. The combination according to claim 4 wherein said means responsive to rotation of said control rod includes a bell crank having a central stationary pivot, one end of said bell crank constituting a cam follower, a cam for actuating said cam follower, a screw means supporting said cam for translatory motion in response to rotation of said screw, means responsive to motion of the other end of said bell crank for actuating said slider in a movement solely of translation, said last means including a lost motion connection between said other end of said bell crank and said slider.

6. The combination according to claim 1 wherein is further provided output terminals for said mixer connected to points adjacent to and straddling the slot in said sheet of metal incorporated in said mixer.

References Cited in the file of this patent

UNITED STATES PATENTS

| | | |
|---|---|---|
| Re. 23,605 | Wallin | Dec. 23, 1952 |
| 2,171,219 | Malter | Aug. 29, 1939 |
| 2,414,115 | Mason | Jan. 14, 1947 |
| 2,471,155 | Langmuir et al. | May 24, 1949 |
| 2,483,893 | Everett | Oct. 4, 1949 |
| 2,513,761 | Tyson | July 4, 1950 |
| 2,540,824 | Kolks | Feb. 6, 1951 |
| 2,760,060 | Wittenburg et al. | Aug. 21, 1956 |